(12) United States Patent
Jang et al.

(10) Patent No.: US 8,993,872 B2
(45) Date of Patent: Mar. 31, 2015

(54) PHOTOVOLTAIC MODULE

(75) Inventors: Daehee Jang, Seoul (KR); Jonghwan Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 115 days.

(21) Appl. No.: 13/470,888

(22) Filed: May 14, 2012

(65) Prior Publication Data

US 2012/0291841 A1    Nov. 22, 2012

(30) Foreign Application Priority Data

May 16, 2011   (KR) .......................... 10-2011-0045766
May 27, 2011   (KR) .......................... 10-2011-0050708

(51) Int. Cl.
*H01L 31/042*    (2014.01)
*H02S 40/10*    (2014.01)
*H02S 40/12*    (2014.01)

(52) U.S. Cl.
CPC ............... *H01L 31/042* (2013.01); *Y02E 10/50* (2013.01); *H02S 40/10* (2014.12); *H02S 40/12* (2014.12)
USPC .......................................................... 136/252

(58) Field of Classification Search
CPC ............................. Y02E 10/50; H01L 31/042
USPC .......................... 136/205, 206, 207, 244, 252
See application file for complete search history.

(56) References Cited

U.S. PATENT DOCUMENTS

| | | | | |
|---|---|---|---|---|
| 2,527,363 | A * | 10/1950 | Jacowitz ........................ | 38/104 |
| 7,693,630 | B1 * | 4/2010 | Mitchell ........................ | 701/36 |
| 7,824,191 | B1 * | 11/2010 | Browder ...................... | 439/76.1 |
| 7,999,173 | B1 * | 8/2011 | Ashpis .......................... | 136/251 |
| 2003/0000718 | A1 * | 1/2003 | Petrenko et al. .............. | 174/19 |
| 2007/0034246 | A1 * | 2/2007 | Nakata .......................... | 136/244 |
| 2009/0179500 | A1 * | 7/2009 | Ragonese et al. ............. | 307/82 |
| 2011/0088741 | A1 * | 4/2011 | Dunton et al. ................ | 136/244 |

FOREIGN PATENT DOCUMENTS

| | | | |
|---|---|---|---|
| JP | 8-250756 | A | 9/1996 |
| JP | 2001-250973 | A | 9/2001 |
| JP | 2003023170 | A * | 1/2003 |
| JP | 2003264308 | A * | 9/2003 |
| JP | 2004-39753 | A | 2/2004 |
| JP | 2009272405 | A * | 11/2009 |

OTHER PUBLICATIONS

Fujimura, Shigeo JP 2003023170 A, Jan. 2003, Japan, machine translation (English).*
Fujikawa et al. JP 2009272405 A, Nov. 2009, Japan, English Equivalent of the abstract.*
Saito et al. JP 2003264308 A, Sep. 2003, Japan, English Equivalent of the abstract.*

* cited by examiner

*Primary Examiner* — Susan D Leong
(74) *Attorney, Agent, or Firm* — McKenna Long & Aldridge LLP

(57) ABSTRACT

A photovoltaic module comprises a solar cell module including a plurality of solar cells; an inverter to convert DC voltage supplied from the solar cell module into AC voltage and to output the AC voltage; and a screen to generate an electric field based on the AC voltage, the screen comprising multiple electrode patterns that can receive AC voltage and being separated from each other. Based on the above, for example, foreign substance such as dust, snow, ice, etc., on the front surface of a photovoltaic module may be removed.

19 Claims, 10 Drawing Sheets

(a)

(b)

PHOTOVOLTAIC MODULE

CROSS-REFERENCE TO RELATED APPLICATION

This application claims the priority benefit of Korean Patent Application No. 10-2011-0045766, filed on May 16, 2011 and Korean Patent Application No. 10-2011-0050708, filed on May 27, 2011 in the Korean Intellectual Property Office, the disclosure of which is incorporated herein by reference.

BACKGROUND

1. Field of the Disclosure

The present disclosure relates to a photovoltaic module. More specifically, the present disclosure relates to a photovoltaic module which may automatically remove foreign substance such as dust, snow, and ice on a front surface of the module.

2. Description of the Related Art

As depletion of conventional energy resources such as oil or coal is anticipated, an interest for alternative energy resources is getting intense in the hope of substituting for the conventional energy resources. Among others, solar cells are getting particular attention from the public as a next generation battery capable of converting solar energy directly into electric energy by using semiconductor devices.

In general, several of the solar cells are connected in series or in parallel for photovoltaic power generation. If a light receiving surface of a photovoltaic module on which solar rays are incident is covered with foreign substance such as dust, output power of some solar cells among series or parallel connected solar cells is diminished.

In this way, if output power of some solar cells is diminished and at the same time, the several solar cells are connected in series, the whole current flows toward a low current side. Similarly, the whole voltage is concentrated toward a low voltage side in the case of parallel connection, degrading the efficiency of a photovoltaic module. In addition, a solar cell of low output power may function as a hot spot, causing a risky situation where the solar cell is damaged due to heat generated as time passes by.

SUMMARY

Therefore, one objective is to provide a photovoltaic module capable of removing foreign substance such as dust on a front surface of the photovoltaic module by generating electric field and removing snow and ice on the front surface of the module by generating heat. The removal of the foreign substance, snow, ice, etc., may be automatic.

To achieve the objective, a photovoltaic module according to an embodiment of the present invention comprises a solar cell module including a plurality of solar cells; an inverter to convert DC voltage supplied from the solar cell module into AC voltage and to output the AC voltage; and a screen to generate an electric field based on the AC voltage, the screen comprising multiple electrode patterns that can receive AC voltage and being separated from each other.

Also, the solar cell module may comprise a switch connecting and separating two electrode patterns and a junction box disposed on a rear surface of the module and the inverter may be disposed within the junction box.

In addition, the screen may be disposed on a front surface of the module and a plurality of electrode lines may be transparent.

Moreover, the solar cell module may comprise a front surface substrate disposed on an upper surface of a plurality of solar cells and a rear surface substrate disposed on a lower surface of the plurality of solar cells, the rear surface substrate having a multi-layer structure and the screen being disposed at the multi-layered rear surface substrate.

Furthermore, at least two electrode patterns may comprise a first electrode pattern and a second electrode pattern; the first electrode pattern may comprise first multiple electrode lines parallel with each other and a first connector connecting the ends of the first multiple electrode lines; the second electrode pattern may be disposed alternatively with the first multiple electrode lines and comprise second multiple electrode lines parallel with each other and a second connector connecting the ends of the second multiple electrode lines; a switch may comprise multiple first switches connecting and separating the other ends of the second multiple electrode lines and the first connector; and multiple second switches connecting and separating the other ends of the first multiple electrode lines and the second connector.

BRIEF DESCRIPTION OF THE DRAWINGS

The accompany drawings, which are included to provide a further understanding of this document and are incorporated in and constitute a part of this specification, illustrate embodiments of the present invention and together with the description serve to explain the principles of the present invention.

DETAILED DESCRIPTION OF THE PREFERRED EMBODIMENTS

Figure 1:
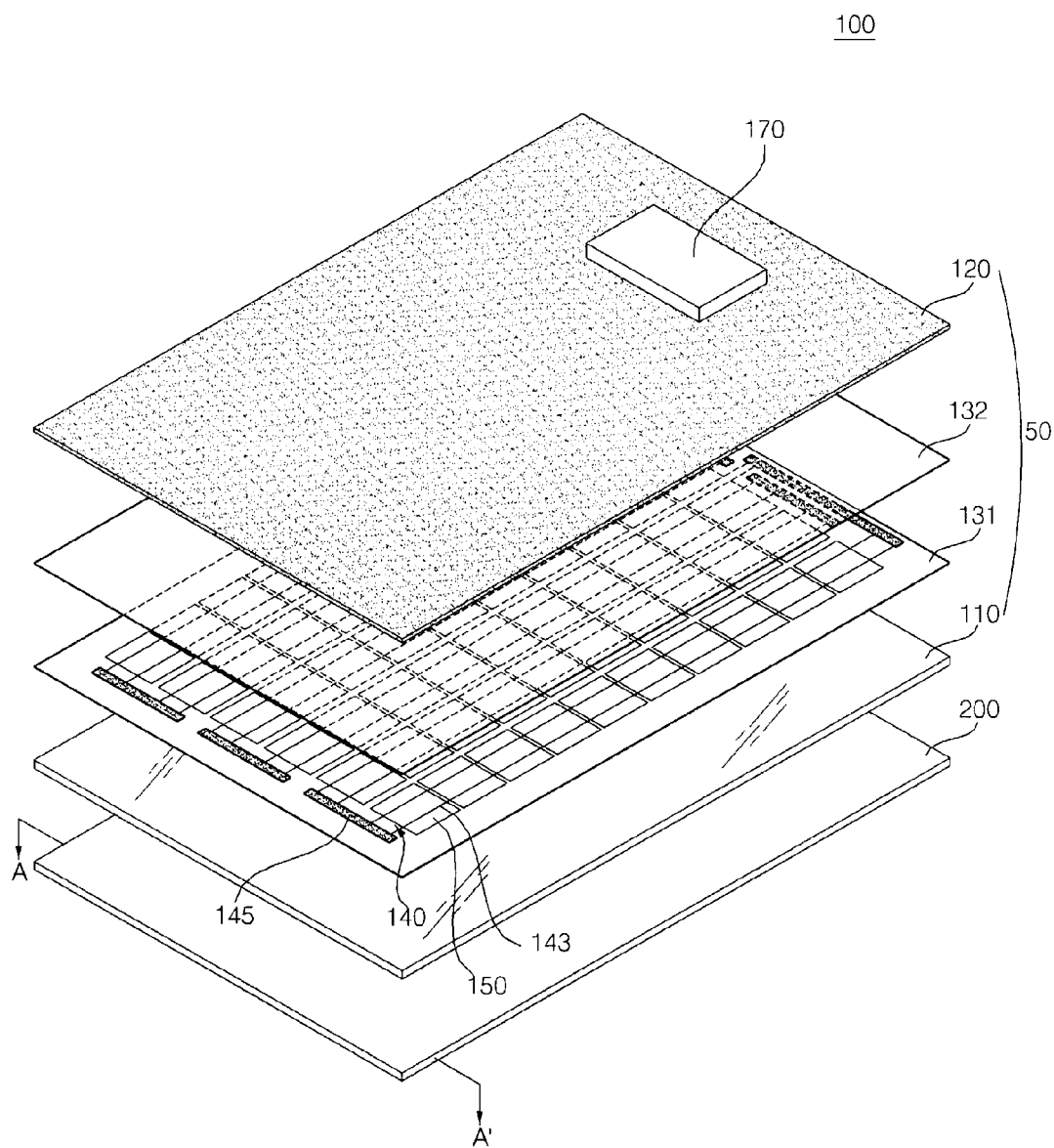
FIG. 1 is a disassembled perspective view of a photovoltaic module according to one embodiment of the present invention.

In what follows, the present disclosure will be described in more detail with reference to appended drawings.

In the drawings below, a constituting element may be exaggerated, omitted, or simplified for the sake of convenience and clarity of description. Size of a constituting element may not reflect its actual size and the same identifying symbols may be used for the same constituting elements.

Also, a suffix "module" or "unit" for constituting elements used in the drawings below has been introduced for the convenience of writing this document, which does not carry a particular importance of its own right or indicate a dedicated role. Therefore, the "module" or the "unit" may be used interchangeably.

Figure 2:
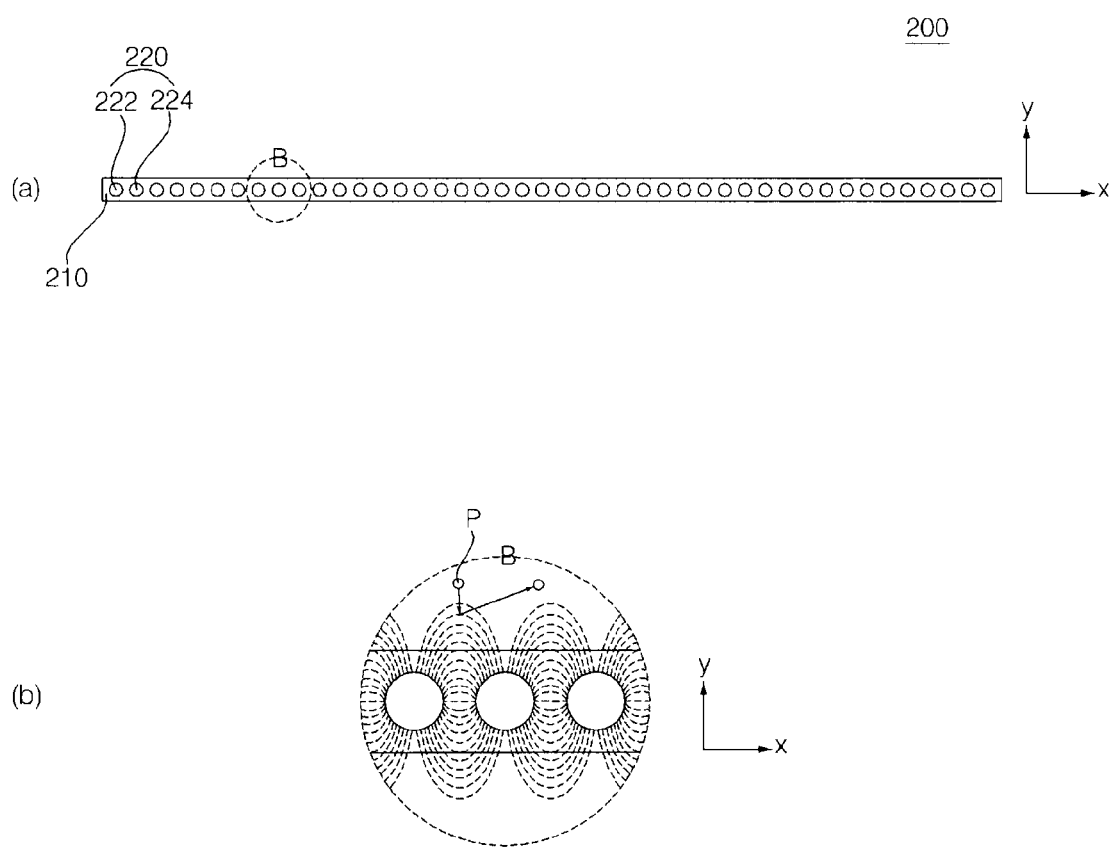
FIG. 2 is a cross-sectional view illustrating A-A' cross section of a screen of the photovoltaic module of FIG. 1.

FIG. 1 is a disassembled perspective view of a photovoltaic module according to one embodiment of the present invention; FIG. 2 is a cross-sectional view illustrating A-A' cross section of a screen of the photovoltaic module of FIG. 1.

With reference to FIG. 1, a photovoltaic module 100 according to one embodiment of the present invention may comprise a solar cell module 50 including a plurality of solar cells 150; an inverter (not shown) converting DC voltage supplied from the solar cell module 50 into AC voltage and outputting the AC voltage; and a screen 200 generating an electric field by receiving AC voltage.

First, the solar cell module 50 may comprise a plurality of solar cells 150; a first sealing film 131 and a second sealing film 132 sealing the plurality of solar cells 150 between the two sealing films; a front substrate 110 protecting a light receiving surface of the solar cells 150; and a rear surface substrate 120 protecting the other surface of the solar cells 150. The solar cell module 50 may comprise a plurality of ribbons 143 connecting the plurality of solar cells 150 electrically and bus ribbons 145 connecting the plurality of ribbons 143.

The solar cell 150 is a semiconductor device which converts solar energy into electrical energy and may be formed by a light receiving surface on which solar rays are incident and the other surface opposite of the light receiving surface.

For example, the solar cell 150 may correspond to a silicon solar cell which comprises a first conductive type silicon substrate; a second conductive type semiconductor layer being formed on a silicon substrate and having a conductive type opposite of the first conductive type; an anti-reflection film comprising at least one or more openings exposing a partial surface of the second conductive type semiconductor layer and being formed on the second conductive type semiconductor layer; a front surface electrode making contact with a partial surface of the second conductive type semiconductor layer exposed through at least one or more openings; and a rear surface electrode formed on a rear surface of the silicon substrate. But the solar cell 150 is not limited to the above and may correspond to a compound semiconductor solar cell or a tandem solar cell.

The plurality of solar cells 150 may be connected electrically in series, parallel, or series-parallel by the ribbon 143. More specifically, the ribbon 143 may connect a front surface electrode formed on a light receiving surface of the solar cell 150 and a rear surface electrode formed on the other side of an adjacent solar cell 150 by a tabbing process. The tabbing process comprises spraying flux on one surface of the solar cell 150, positioning the ribbon 143 on the solar cell 150 on which flux is sprayed, and applying calcination.

In this way, the plurality of solar cells 150 connected electrically by the ribbon 143 forms a string 140 and the solar cell string 140 may be disposed in such a way that they are adjacent to each other forming a plurality of rows.

In the figure, the ribbon 143 is formed as two lines; due to the ribbon 143, a plurality of solar cells 150 are connected in a series, forming six strings. The figure illustrates a case where each string is comprised of ten solar cells 150, but is not limited to the above and may allow for various modifications.

Meanwhile, each solar cell string 140 may be connected electrically by bus ribbon 145. More specifically, the bus ribbon 145 is disposed horizontally at an end of two solar cell string 140 disposed in multiple columns, and connecting an end of the ribbon 143 of the two solar cell strings 140. Also, though not shown in the figure, the bus ribbon 145 is connected to a junction box 170 disposed on a rear surface of the solar cell module 50.

The solar cell string 140 forming multiple columns may be disposed between the first sealing film 131 and the second sealing film 132.

The first sealing film 131 may be disposed on a light receiving surface of the solar cell 150 and the second sealing film 132 may be disposed on the other surface of the solar cell 150. The first 131 and the second sealing film 132 are fastened to each other by lamination, isolating moisture or oxygen which may impose an adverse effect on the solar cells 150.

Also, the first 131 and the second sealing film 132 help each element of the solar cells 150 combine chemically with each other. For the first 131 and the second sealing film 132, ethylene vinyl acetate (EVA) copolymer resin, polyvinyl butyral, ethylene vinyl acetate partial oxide, silicon resin, ester resin, olefin resin, etc. may be employed.

It is preferable that the front surface substrate 110 is positioned on the first sealing film 131 and the substrate 110 is made of reinforced glass to protect the solar cells 150 from external shocks and let solar rays to pass through. Also, it is more preferable that low iron reinforced glass is used for preventing reflection of solar rays and increasing permeability of solar rays.

The rear surface substrate 120 is intended to protect solar cells at the rear surface of the solar cells, providing functions of water proofing, insulation, and ultraviolet blocking. The rear surface substrate 120 may be TPT (Tedlar/PET/Tedlar) type but is not limited to the above. Also, it is preferable that the rear surface substrate 120 is made of a material with high reflectivity in order to reflect and reuse solar rays coming from the front surface substrate 110 side. However, the rear surface substrate 120 may be formed by a transparent material through which solar rays may pass through, leading to the implementation of a double sided solar cell module.

The solar cell module 50 above generates DC voltage and an inverter (not shown) converts DC voltage supplied from the solar cell module 50 into AC voltage and outputs the AC voltage. As one example, the inverter may be disposed within a junction box 170 to be described later, but is not limited to the above; and in one example, a micro inverter may be installed at the solar cell module 50.

With reference to FIG. 1, the junction box 170 may be disposed on the rear surface substrate 120 of the solar cell module 50; and may comprise a capacitor unit charging and discharging electric energy generated from a solar cell 150 and circuit elements such as diodes preventing an electric current flowing backward. Water blocking coating may be applied to the inside of the junction box 170 to protect the circuit elements.

Also, the junction box 170 may generate high heat from diodes at the time of operation. Since the heat generated may reduce efficiency of a particular solar cells 150 arranged at the position where the junction box 170 is attached, the junction box 170 may further comprise a heat radiation member (not shown) disposed between the solar cell module 50 and the junction box 170.

At this time, to dissipate heat generated from the junction box 170, it is preferred that the area of the heat radiation member is larger than that of the junction box 170. For example, the heat radiation member may be formed across the entire rear surface of the solar cell module 50. Also, it is preferable that the heat radiation member is formed by metallic substance with excellent thermal conductivity such as Au, Ag, Cu, Al, and W.

Meanwhile, as will be described later in FIGS. 3 and 4, the junction box 170 according to one embodiment of the present invention may comprise an inverter (174 in FIG. 3) converting DC voltage supplied from the solar cell module 50 to AC voltage and outputting the AC voltage. The AC voltage output from the inverter is supplied to a screen 200, whereby the screen may generate an electric field.

FIG. 2 is a cross-sectional view illustrating A-A' cross section of a screen 200 of the photovoltaic module 100 of FIG. 1. With reference to FIG. 2(a), the screen 200 may comprise an electrode pattern 220 to which AC voltage is applied. For example, the electrode pattern 220 may be disposed within a base film 210.

The base film 210 may be formed by polymer with excellent optical permeability for ensuring insulation between electrode patterns 220 and preventing optical absorption into the solar cell 150 when the screen 200 is disposed on the front surface substrate 110 of the solar cell module 50—for example, polyethylene terephthalate, polycarbonate, polypropylene, polyethylene, polystylene, and polyepoxy.

The electrode pattern 200, too, may be formed by those materials having a translucent property to avoid interference in optical absorption in the solar cell 150 such as ITO, IZO (In—ZnO), GZO(Ga—ZnO), AZO(Al—ZnO), AGZO(Al—Ga ZnO), IGZO(In—Ga ZnO), IrOx, and RuOx.

Meanwhile, AC voltage output from the inverter (not shown) is supplied to the electrode pattern 220 and the electrode pattern 220 may be formed as two electrode patterns 222, 224 separated from each other as will be described later in FIGS. 10 to 14.

At least two electrode patterns 222, 224 separated from each other may be disposed in an alternate fashion and when AC voltage is applied, a current does not flow through the electrode patterns since they are in an open state and the electrode patterns are electrified with opposite polarities to each other.

Therefore, if AC voltage is applied to at least two electrode patterns 222, 224 separated from each other, electric field is generated as shown in FIG. 2(b).

Meanwhile, since AC voltage applied has constant alternating frequency, polarities of at least two electrode patterns 222, 224 separated from each other change periodically due to the alternating frequency of the AC voltage.

To describe the process of removing foreign substance P such as dust by electric field with reference to FIG. 2(b), first, moving force along x-direction and buoyancy along y-direction are applied to foreign substance P such as dust electrified with positive or negative polarity due to the electric field. At this time, x-direction does not imply a particular direction on the screen 200 but is an arbitrary direction parallel to the surface of the screen 200.

In other words, foreign substance P such as dust electrified with positive or negative polarity floats above the surface of the screen 200 by buoyancy due to the electric field and at the same time, moves along the surface of the screen 200 according to periodic change of electric field generated between at least two electrode patterns 222, 224 separated from each other.

At this time, foreign substance P such as dust may be removed from the surface of the screen 200 when the moving force along x-direction is larger than adhesive force of the foreign substance P and buoyancy along y-direction is larger than gravity and adhesive force. The moving force and the buoyancy is proportional to the magnitude of AC voltage applied to electrode patterns 220; therefore, large sized foreign substance P may also be removed by adjusting the magnitude of AC voltage applied.

Also, the bigger the frequency of AC voltage applied to the electrode pattern 220, the faster foreign substance P such as dust may be removed. Meanwhile, the narrower the distance becomes between at least two electrode patterns 222, 224 separated from each other, the faster the foreign substance P may be removed.

Meanwhile, foreign substance P such as dust not electrified may also be removed from the screen 200 due to triboelectric effect. In other words, foreign substance P such as dust not electrified first sink to the surface of the screen 200. After the foreign substance P not electrified makes contact to the surface, it is charged due to the triboelectric effect. Therefore, the buoyancy and the moving force are applied to the charged foreign substance P, eventually removing it from the screen 200.

Accordingly, foreign substance P such as dust attached on a light receiving surface of the photovoltaic module 100 may be removed automatically.

Meanwhile, as shown in FIGS. 5 to 9, the screen 200 may comprise a switch (for example, 840 in FIG. 10) capable of connecting at least two electrode patterns 222, 224 separated from each other. If the switch is turned on, at least two electrode patterns 222, 224 separated from each other is connected, allowing a current to flow. Such a current flow generates heat and snow, ice, etc. on the front surface of a photovoltaic module 100 may be removed due to the heat generated.

Therefore, a photovoltaic module 100 according to embodiments of the present invention may prevent efficiency of the photovoltaic module 100 from being degraded by removing foreign substances such as dust or snow on the front surface of the photovoltaic module 100 and may minimize occurrence of hot spots. Also, since a time period for periodic washing to remove foreign substances may be extended, time and maintenance cost for washing the photovoltaic module may be reduced.

The screen 200 may be attached to the front surface substrate 110 of the solar cell module 50 by using transparent adhesion layer (not shown). The transparent adhesion layer may be in the form of film or may be formed by spraying adhesive formed by a material having fluidity and adhesive property such as acryl, epoxy, etc., on the front surface substrate 110. The adhesion layer attaches the screen 200 to the front surface substrate 110 and at the same time, seals the electrode pattern 220, thereby protecting the electrode pattern 220 from foreign substances such as moisture, dust, etc. from the outside.

On the other hand, although FIG. 1 illustrates a case where the screen 200 is disposed on the front surface substrate 110 of the solar cell module 50, which is not limited to the above case; the screen 200 may be disposed within the rear surface substrate 120. As one example, the rear surface substrate 120 may be made to have a multi-layer structure such as TPT (Tedlar/PET/Tedlar); at this time, the screen 200 may be disposed inside the rear surface substrate 120 which has a multi-layer structure for the purpose of insulation.

In this way, if the screen 200 is disposed between the multi-layer structure of the rear surface substrate 120, optical absorption into the solar cell 150 is not blocked; therefore, it is not necessary for the electrode pattern 220 and the base film 210 to have permeability. In other words, the electrode pattern 220 may be made from opaque material which may be metallic.

Also, it is equally possible that the electrode pattern 220 without the base film 210 is formed between the multi-layer structure of the rear surface substrate 120. At this time, the electrode pattern 220 formed is coated with insulation film, preventing electrical discharge and spark which may be generated between electrode patterns 220.

Meanwhile, the photovoltaic module 100 according to one embodiment of the present invention may comprise a controller (not shown) controlling operation of a charge-discharge unit (not shown) charging and discharging DC voltage produced at the solar cell module 50, timing for providing AC voltage to the screen 200, and operation of the switch (not shown).

The charging-recharging unit may charge DC voltage produced at the solar cell module 50 and provide charging voltage charged to a capacitor unit (172 in FIG. 3), an inverter (174 in FIG. 3), or a converter (176 in FIG. 4) to be described later. The charging-discharging unit may employ a secondary battery, electric double layer condenser, etc.

The controller, by providing AC voltage to the screen 200 at a predetermined time point, may control the inverter 174 and the charging-discharging unit to help periodically removing foreign substance such as dust. For example, the controller may provide AC voltage to the screen 200 during the night time by storing DC voltage by controlling the charging-discharging unit during the daytime and controlling operation of the charging-discharging unit and the inverter to be described later in FIG. 3 during the nighttime.

Also, the controller may support removing snow or ice on the front surface of the photovoltaic module 100 by sensing the temperature of the surface of the photovoltaic module 100, controlling operation of the switch (not shown) of the screen 200, and thus generating heat based on the aforementioned operation.

Figure 3:
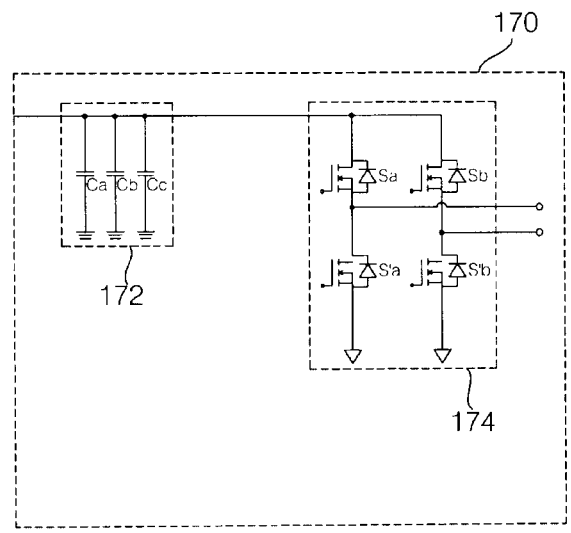
FIG. 3 illustrates one example of an internal circuit of a junction box of the photovoltaic module according to one embodiment of the invention.

FIG. 3 illustrates one example of an internal circuit of a junction box of the photovoltaic module according to an embodiment of the present invention.

With reference to FIG. 3, the junction box 170 according to the embodiment of the present invention may comprise a capacitor unit 172 and an inverter 174. Therefore, the junction box 170 may output AC voltage.

The capacitor unit 172 stores DC voltage supplied from the solar cell module 50. Although the figure illustrates a case where three capacitors Ca, Cb, Cc are connected in parallel, a series connection or a combination of series-parallel connection may be used based on design choice.

It is preferable that the capacitor unit 172 is installed in the junction box 170 in detachable form. For example, it is possible that the individual capacitor Ca, Cb, Cc form a stack structure, being disposed in parallel to each other within a frame. The capacitor unit 172 above may be attached or detached to the groove area within the junction box 170 as a module. According to the structure, a replacement may be easily done at the time of changing the capacitor unit 172 due to product lifecycle or failure.

The inverter 174 converts DC voltage to AC voltage. The figure illustrates the case of a full-bridge inverter. In other words, upper arm switching elements Sa, Sb and lower arm switching elements S'a, S'b connected in series with each other make a pair, respectively, and a total of two pairs of upper and lower arm switching elements are connected in parallel to each other. A diode is connected to each switching element Sa, S'a, Sb, S'b in reverse-parallel direction.

Switching elements within the inverter 174, based on an inverter switching control signal from an inverter controller (not shown), performs on-off operation. According to the on-off operation, AC voltage of predetermined frequency is output.

As described above, by employing the capacitor unit 172 storing DC voltage within the junction box 170 and the inverter 174 converting the stored DC voltage to AC voltage and outputting the AC voltage, AC voltage may be supplied to the screen 200 of FIG. 1 in a simple way through the junction box 170.

Figure 4:
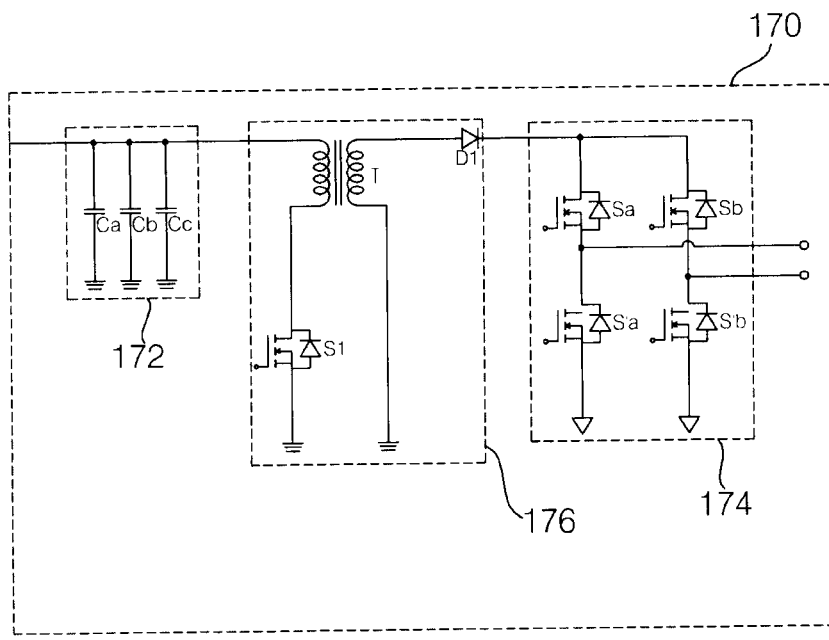
FIG. 4 illustrates one example of an internal circuit of a junction box of the photovoltaic module according to another embodiment of the invention.

FIG. 4 illustrates one example of an internal circuit of a junction box of the photovoltaic module according to another embodiment of the present invention.

With reference to FIG. 4, the junction box 170 according to another embodiment of the present invention may comprise a capacitor unit 172, a DC/DC converter 176, and an inverter 174. Since the capacitor unit 172 and the inverter 174 are the same as that described in FIG. 3, detailed description about the two will be omitted.

The DC/DC converter 176 carries out a conversion of DC level by using a DC power stored in the capacitor unit 172. The figure illustrates a turn-on timing of a switching element S1 and a flyback converter employing the turns ratio of a transformer T. By using the above, voltage boosting in DC level may be carried out. Meanwhile, a converter controller (not shown) for turn-on timing control of the switching element S1 may be further installed.

Meanwhile, the DC/DC converter 172, besides the flyback converter shown in the figure, may be implemented by a boost converter, a buck converter, a forward converter, or a combination of the above (e.g., a cascaded buck-boost converter).

As described above, the level-transformed DC voltage may be converted into AC voltage and may be supplied to the screen 200 of FIG. 1. Therefore, AC power with large electric power may be supplied to the screen 200; accordingly, foreign substance of large size may be removed.

On the other hand, a capacitor unit (not shown) for storing level-changed DC power may be further installed between the DC/DC converter 176 and the inverter 174. The capacitor unit (not shown), similar to the capacitor unit 172 described above, may be equipped with a plurality of capacitors.

FIGS. 5 to 14 illustrate a screen included in a photovoltaic module of the present invention.

Figure 5:
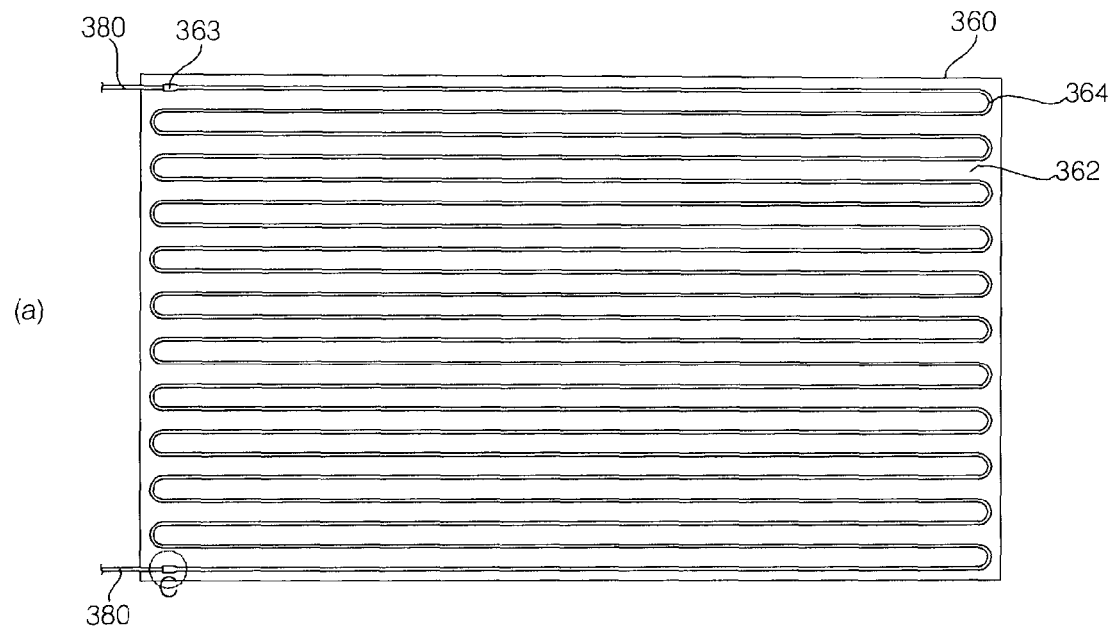
FIGS. 5 to 14 illustrate a screen included in a photovoltaic module according to various embodiments of the present invention.
Figure 5:
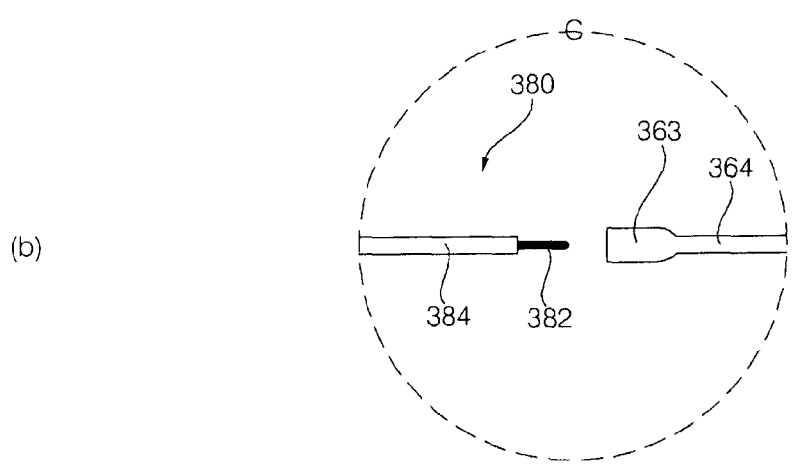

First, with reference to FIG. 5, a screen 360 comprises a base film 362 and a plurality of electrode patterns 364; the plurality of electrode patterns 364 may be connected to a cable 380 used for applying AC power.

As shown in FIG. 5(a), the plurality of electrode patterns 364 may be connected in series, or may be an electrode pattern of a single line, that zig-zag across the screen 360. At this time, the narrower a gap becomes between electrode patterns 364 adjacent to each other, the faster the speed becomes in removing foreign substance off the screen 360. However, if the gap between electrode patterns 364 becomes too narrow, electric discharge and sparks may occur between adjacent electrode patterns 364.

It is preferable that the electrode pattern 364 forms a groove in an insulated base film 362 and becomes surrounded by the base film 362 by employing a method of burying the electrode pattern 364 in the base film 362.

At least one end of a pair of the cable 380 is connected to the electrode pattern 364 and the other end is connected to the inverter (for example, see FIG. 3) delivering AC power to the electrode pattern 364.

One end of the cable 380 is extended up to the inside of the base film 362. Then the cable 380 may be either soldered to the electric pattern 364 or connected to the electric pattern 364 electrically being compressed while it is inserted into the base film 362.

FIG. 5(b) is a magnified view of FIG. 5(c). As shown in FIG. 5(b), a fastening groove is formed at one end of the electric pattern 364 and a connection terminal 382 which may be combined with the fastening groove is formed at one end of the cable 380. Thus, as the fastening groove 363 and the connection terminal 382 are combined together, the cable 380 and the electrode pattern 364 may be connected to each other easily.

Also, the other end of the cable 380 connected to the inverter may have the same structure. Therefore, if abnormality happens in the cable 380, the junction box above (170 of FIG. 1) or the screen 360 may be easily replaced.

Meanwhile, since the cable 380 may be exposed to the outside except for the connection terminal 382, it is preferable that the cable 380 is protected by insulation layer 384 or protected by coating. Conversely, a groove may be formed in the cable 380 and a protrusion which may be combined with the groove may be formed at the electrode pattern 364.

The cable 380 and the base film 362 described above may be equally applied to FIGS. 6 to 14.

Figure 6:
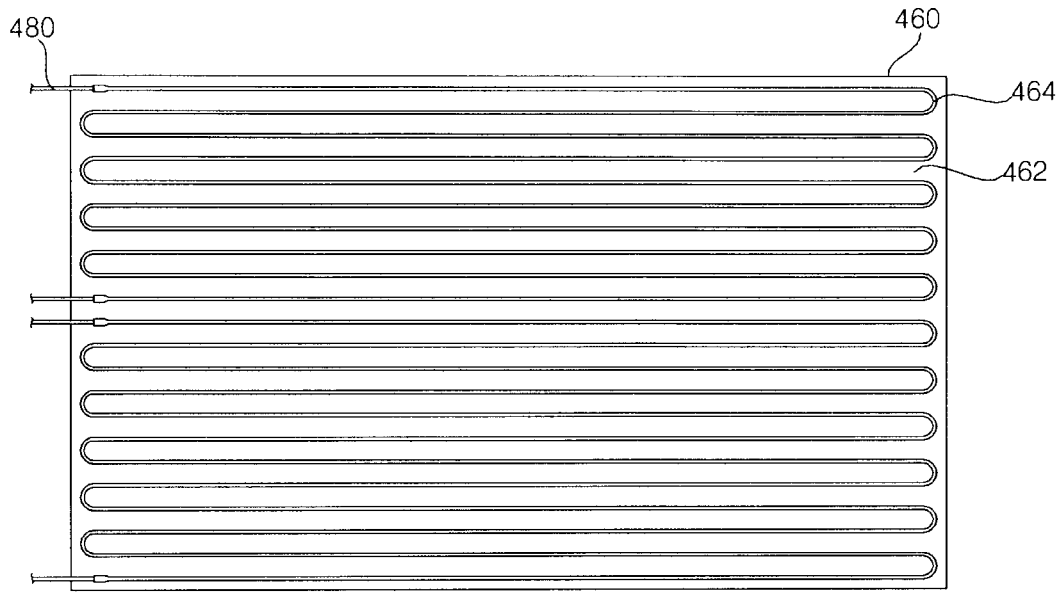

In FIG. 6, two separated lines form a plurality of electrode patterns 464 on the screen 460 and two pairs of cables 480 are connected to the two separated lines respectively, supplying AC power independently. Therefore, increase of resistance according to the length of a plurality of electrode patterns 464 connected in series is prevented and generation of heat may be minimized.

Figure 7:
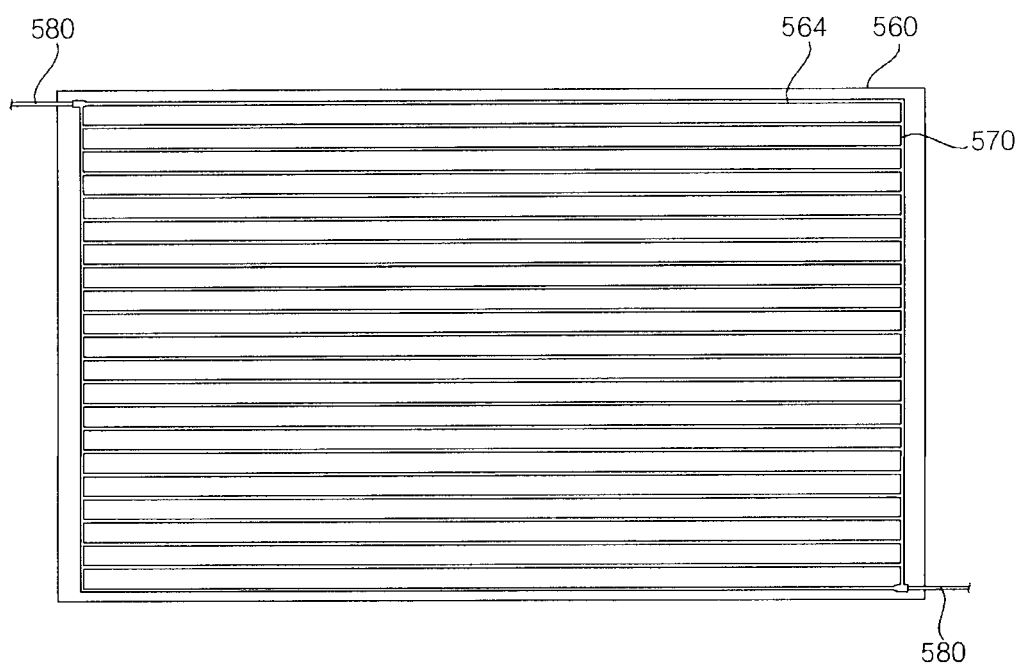

The screen 560 shown in FIG. 7 illustrates a case where both ends of a plurality of electrode patterns 564 are connected in parallel by connecting lines 570. Therefore, voltage of AC power applied to the plurality of electrode patterns 564 may be distributed equally and thus resistance against the plurality of electrode patterns 564 may be reduced.

Figure 8:
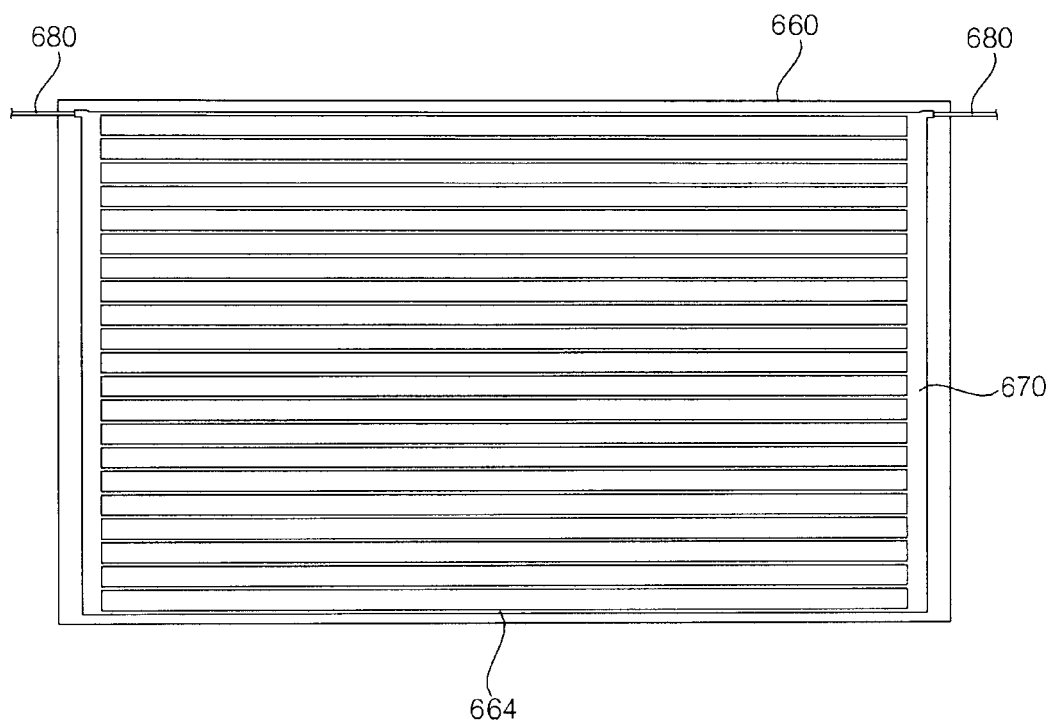

The screen 660 of FIG. 8 comprises pads 670 connecting a plurality of electrode patterns 664 in parallel.

Since a width of the pad 670 is larger than that of the electrode pattern 664 or the connecting lines 570 of FIG. 7, it is easy to connect to a plurality of electrode patterns 664 connected in parallel and a cable 680 supplying AC power. In particular, it may be a lot simpler to form an insertion groove shown in FIG. 5(b) using a wide pad 670.

Figure 9:
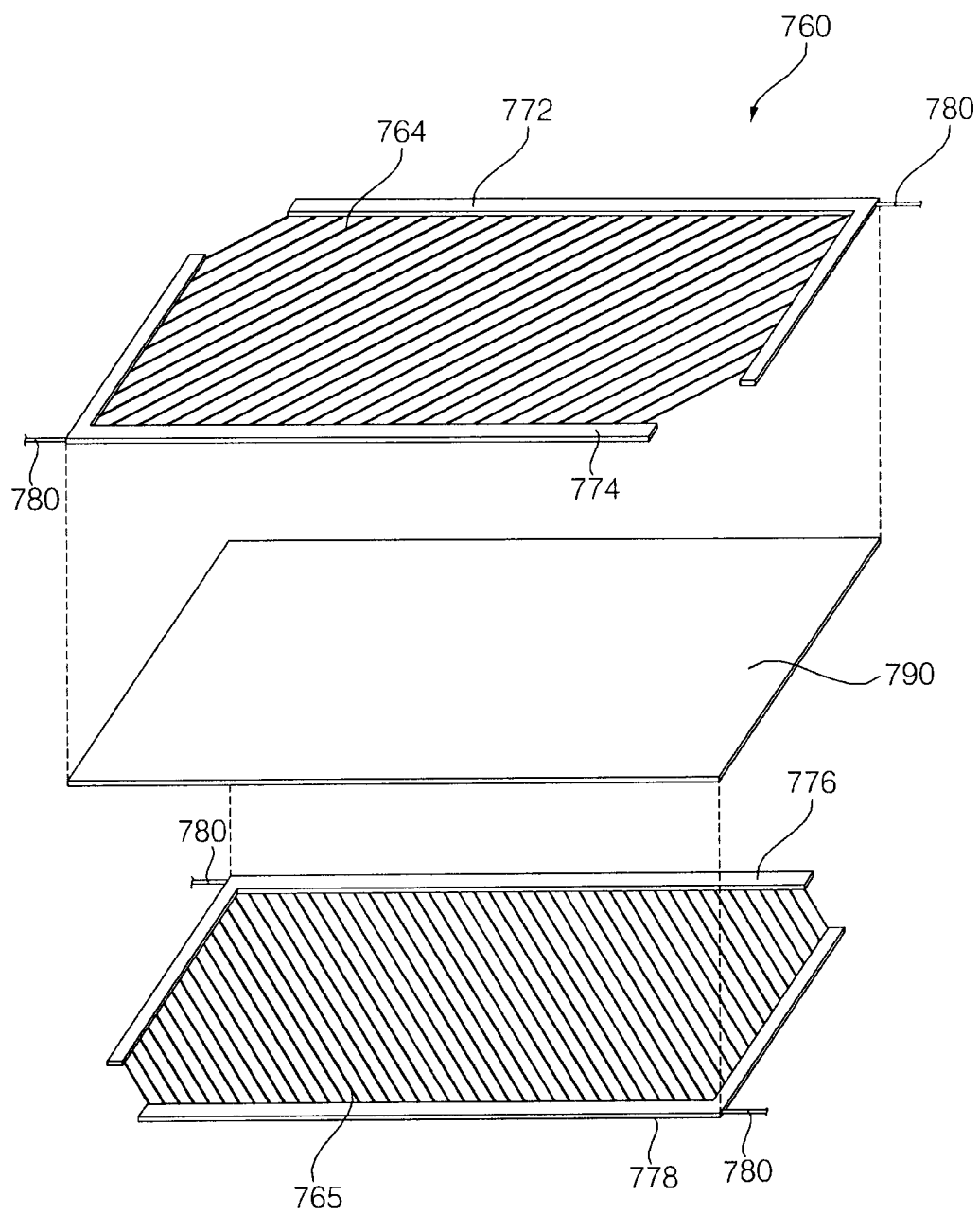

FIG. 9 illustrates one example of the screen 760 according to an embodiment of the present invention. With reference to FIG. 9, the screen 760 may comprise an insulation layer 790 within a base film (not shown) and a plurality of electrode patterns may comprise a plurality of first electrode patterns 764 having a direction on one surface and a plurality of second electrode patterns 765 having a different direction on a different surface. The insulation layer 790 may be in the form of a film and it is preferable that the insulation layer 790 has a size larger than that of an area in which the first 764 and the second electrode patterns 765 are formed.

The plurality of first electrode patterns 764 are connected in parallel by a first pad 772 and a second pad 774. The first pad 772 and the second pad 774 are connected to a cable 780 to supply AC power to the first electrode patterns 764.

Also, the plurality of second electrode patterns 765 are connected in parallel by a third 776 and a fourth pad 778. The third pad 776 and the fourth pad 778 are also connected to the cable 780.

Therefore, the plurality of first electrode patterns 764 and the plurality of second electrode patterns 765 insulated against each other by the insulation layer 690 together form a mesh that is capable of more effectively generating electric field according to application of AC power.

Disposition of a plurality of electrode patterns above is not limited to the above example but the plurality of electrode patterns may be connected with appropriate gaps and various forms by taking account of speed for removing foreign substance, occurrence of electric discharge, and occurrence of resistance and heat.

Figure 10:
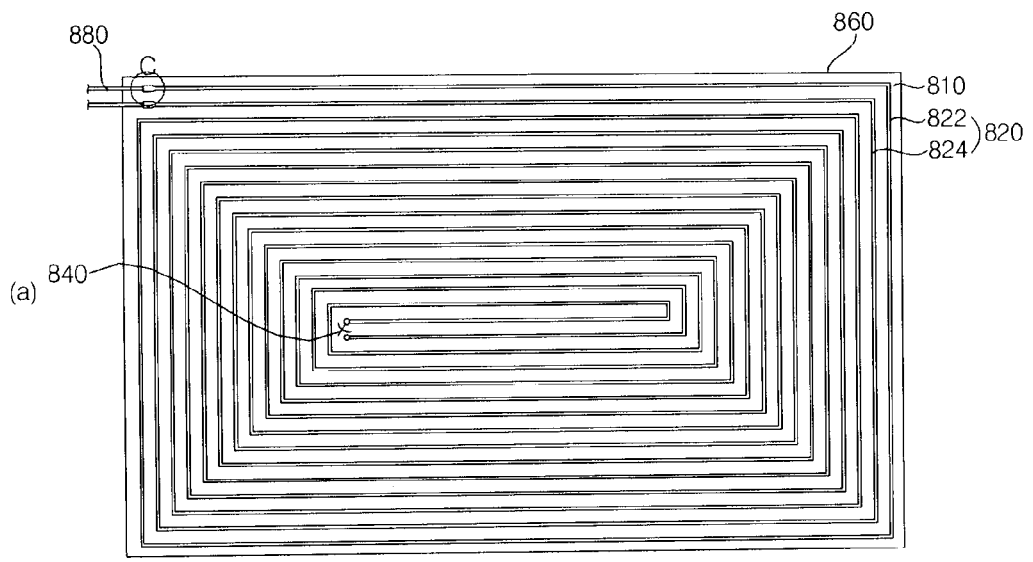

With reference to FIG. 10, a screen 860 may comprise a plurality of electrode patterns 820. The plurality of electrode patterns 820 may comprise first electrode patterns 822 and second electrode patterns 824 separated from each other. Also, the screen 860 may comprise a switch 840 connecting and separating the first 822 and the second electrode patterns 824.

The first electrode pattern 822 and the second electrode pattern 824 separated from each other are formed in parallel but do not intersect with each other, and may be formed in a spiral fashion to be disposed alternately. Also, to maximize electric field generated from the surface of the screen 860, as shown in the figure, the first electrode pattern 822 and the second electrode pattern 824 separated from each other may be formed to have a spiral structure as shown in the figure and to have the same form as that of the base film 810.

Meanwhile, if AC power is applied to the first 822 and the second electrode patterns 824, a current does not flow but the first 822 and the second electrode patterns 824 are electrified to have different polarities from each other. Therefore, direction of an electric field generated between the first 822 and the second electrode pattern 824 changes periodically with the alternating frequency of the AC power, by which foreign substance on the photovoltaic module may be removed.

At this time, the narrower a gap becomes between the first electrode pattern 822 and the second electrode pattern 824 adjacent to each other, the faster the speed becomes of removing foreign substance. If it is the case that the gap between the first 822 and the second electrode pattern 824 becomes too narrow, however, electric discharge and sparks may occur between adjacent electrode patterns.

Meanwhile, the switch 840 connects and separates the first 822 and the second electrode pattern 824 according to the control of a controller. As one example, the controller (not shown) senses surface temperature of the photovoltaic module and may control operation of the switch 840 according to the sensed temperature.

If the switch 840 is turned on, the first electrode pattern 822 and the second electrode pattern 824 are connected and a current starts to flow. The current flow passing through the first electrode pattern 822 and the second electrode pattern 824 generates heat due to resistance and the generated heat may melt snow or ice covered on the front surface of the photovoltaic module, thereby removing the foreign substance.

Figure 11:
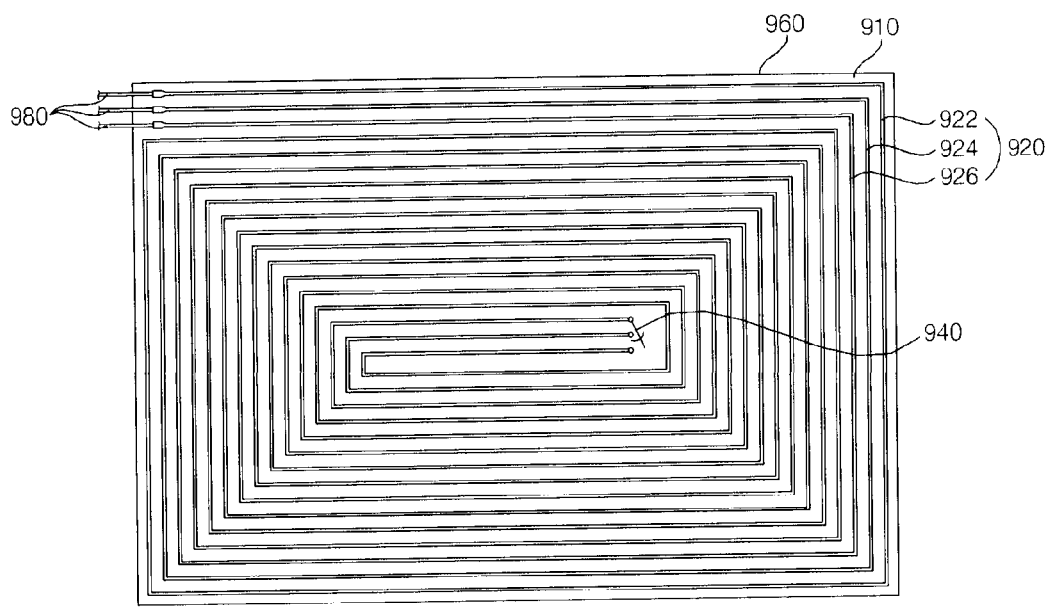

With reference to FIG. 11, the screen 960 is formed in a base film 910 and may comprise an electrode pattern 920 that may include a first electrode pattern 922, a second electrode pattern 924, and a third electrode pattern 926 formed in a spiral fashion, being separated from each other and parallel to each other. One end of the first electrode pattern 922, the second electrode pattern 924, and the third electrode pattern 926 is connected to a cable 980 for supplying AC power. A switch 940 is disposed at the other ends of the first electrode pattern 922, the second electrode pattern 924, and the third electrode pattern 926, to connect or separate the first electrode pattern 922, the second electrode pattern 924, and the third electrode pattern 926.

At this time, AC power supplied to the first electrode pattern 922, the second electrode pattern 924, and the third electrode pattern 926 may be three-phase AC power with a phase difference of 120 degrees from each other. Therefore, power consumption may be reduced. Also, the first electrode pattern 922, the second electrode pattern 924, and the third electrode pattern 926 connected by the switch 940 may connect them in a Y connection.

Figure 12:
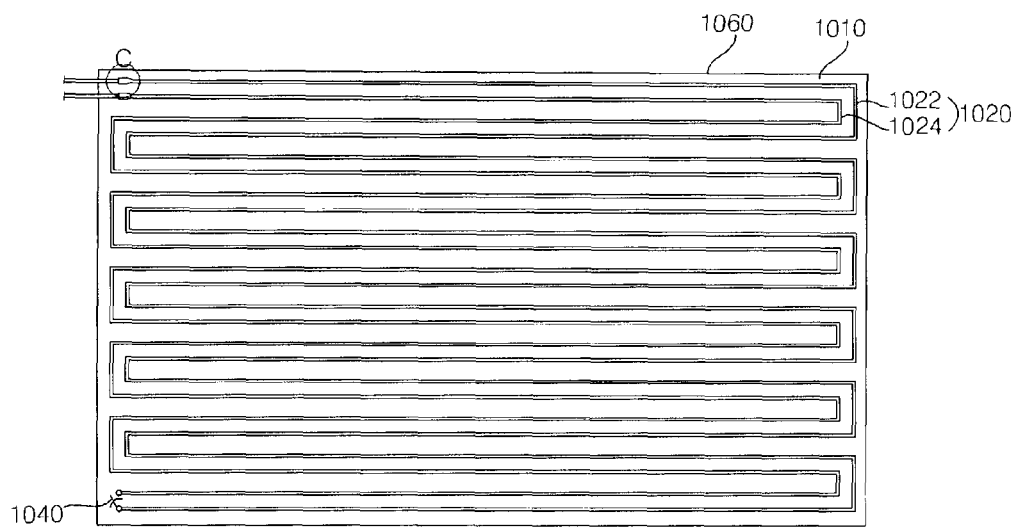

The screen 1060 shown in FIG. 12 is equipped with an electrode pattern 1020 comprising a first electrode pattern 1022 and a second electrode pattern 1024 within a base film 1010.

The first electrode pattern 1022 and the second electrode pattern 1024 are formed in parallel to each other and bent in a continuous 'ㄹ' shape to maximize formation of an electric field. If the first electrode pattern 1022 and the second electrode pattern 1024 are formed while including a bend in a continuous 'ㄹ' shape from an upper to a lower direction, a switch 1040 connecting and separating the first electrode pattern 1022 and the second electrode pattern 1024 may be formed at a corner of the base film 1010, simplifying the manufacturing of the screen 1060. Also, the above formation may avoid blocking progress of incident solar rays when the screen 1060 is disposed on the front surface of the photovoltaic module.

Figure 13:
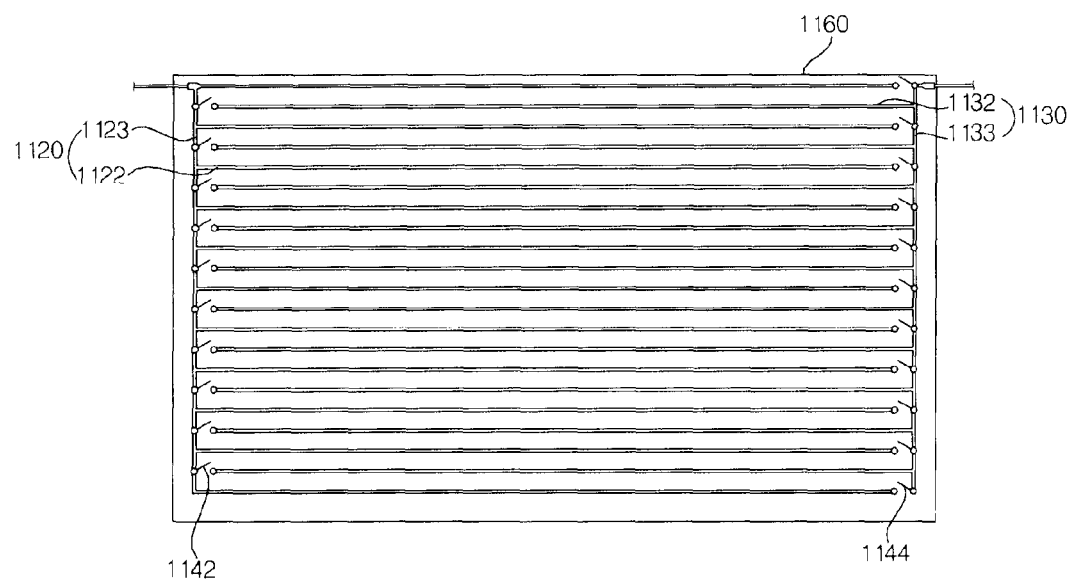

With reference to FIG. 13, the screen 1160 may comprise a first electrode pattern 1120 and a second electrode pattern 1130.

The first electrode pattern 1120 may comprise first multiple electrode lines 1122 that are parallel to each other and a first connector 1123 connecting one end of the first multiple electrode lines 1122. The second electrode pattern 1130 comprise second multiple electrode lines 1132 that are parallel to each other and being disposed alternately with the first multiple electrode lines 1122; and a second connector 1133 connecting one end of the second multiple electrode lines 1132.

Also, the screen 1160 may comprise a plurality of first switches 1142 connecting and separating the other end of the second multiple electrode lines 1132 and the first connector 1123; and a plurality of second switches 1144 connecting and separating the other end of the first multiple electrode lines 1122 and the second connector 1133.

The plurality of first switches 1142 and the plurality of second switches 1144 may be controlled by a controller (not shown). In other words, if the plurality of first switches 1142 and the plurality of second switches 1144 separate the other end of the second multiple electrode lines 1132 and the first connector 1123, and separate the other end of the first multiple electrode lines 1122 and the second connector 1133, respectively, foreign substance on the front surface of the photovoltaic module or the screen 1160 may be removed as an electric field is generated between the first electrode pattern 1120 and the second electrode pattern 1130. If the plurality of first switches 1142 and the plurality of second switches 1144 connect the other end of the second multiple electrode lines 1132 and the first connector 1123, and connect the other end of the first multiple electrode lines 1122 and the second connector 1133, respectively, snow or ice may be removed as heat is generated due to a current flow.

Also, the controller may control the plurality of first switches 1142 and the plurality of second switches 1144 to operate independently.

Figure 14:
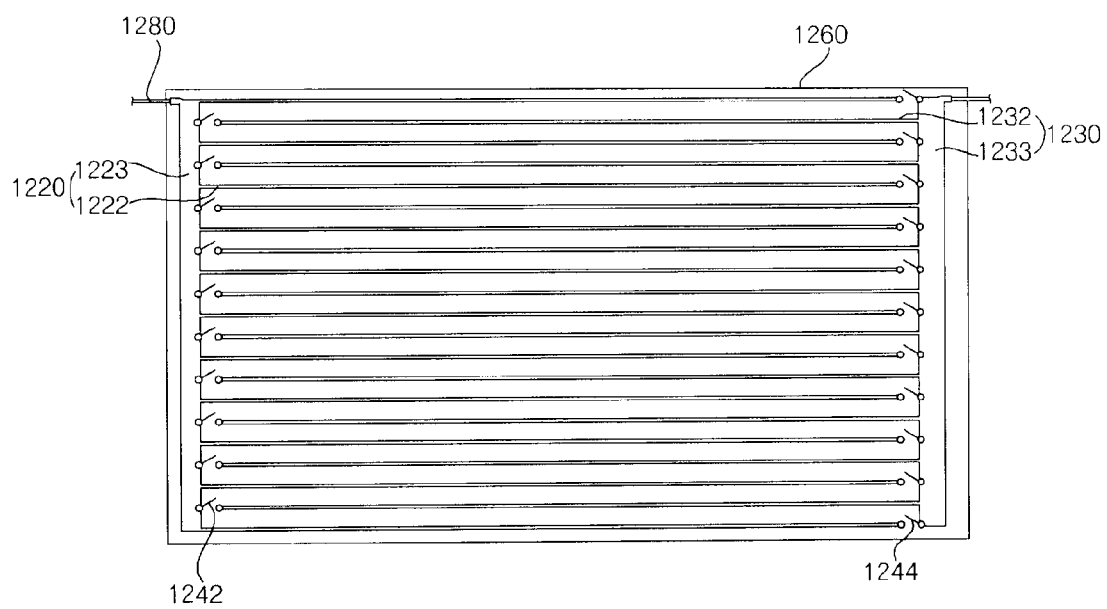

Similar to the screen 1160 of FIG. 13, the screen 1260 of FIG. 14 may comprise a first electrode pattern 1220 and a second electrode pattern 1230. However, one ends of first multiple electrode lines 1222 parallel to each other are connected through a first pad 1223 while one ends of second multiple electrode lines 1232 parallel to each other are connected through a second pad 1233.

At least one of the first 1223 and the second pad 1233 may be formed to be wider than the widths of the first multiple electrode lines 1222 and the second multiple electrode lines 1232. Therefore, connection to a cable 1280 for supplying AC power may be made simple. In particular, it may be a lot simpler to form an insertion groove shown in FIG. 5(*b*) for the first 1223 and the second 1233 pad with wide width.

Meanwhile, first multiple switches 1242 and second multiple switches 1244 may be operated according to the control of a controller; in particular, they may be operated independently.

The photovoltaic module according to the present invention is not limited to combination of the embodiments described above or carrying out the methods described above. On the contrary, the whole or part of the respective embodiments may be combined selectively so that various modifications of the embodiments may be made possible.

As described above, a photovoltaic module according to an embodiment of the present invention may prevent efficiency of the photovoltaic module from being degraded by removing foreign substances such as dust or snow on the front surface of the photovoltaic module and may minimize occurrence of hot spots.

Also, since a time period for periodic washing to remove foreign substances may be extended, time and maintenance cost for washing may be reduced.

Also, by employing an inverter converting DC power within a junction box into AC power and outputting the AC power, AC voltage may be supplied in a simple way through the junction box.

Preferred embodiments of the present invention have been described. However, the present invention is not limited to the specific embodiments described above, various modifications of the embodiments are possible by those skilled in the art to which the present invention belongs without leaving the scope defined by the appended claims.

What is claimed is:

1. A photovoltaic module, comprising:
    a solar cell module including a plurality of solar cells;
    an inverter converting DC voltage supplied from the solar cell module into AC voltage and outputting the AC voltage; and
    a screen generating an electric field based on the AC voltage, the screen comprising multiple electrode patterns separated from each other that receive AC voltage and a switch, the multiple electrode patterns comprising a first electrode pattern and a second electrode pattern,
    wherein the switch is configured to connect and disconnect the first electrode pattern and the second electrode pattern
    forming the electric field having periodic change to eliminate a first material from the screen when the switch is in an off state and the first and the second electrode patterns are electrically open, and
    wherein heat is generated to melt a second material on the screen when the switch is configured to be in an on state and the first and the second electrode patterns are electrically connected.

2. The photovoltaic module of claim 1, wherein the screen further comprises a base film and the multiple electrode patterns are on the base film.

3. The photovoltaic module of claim 2, further comprising a cable connecting the inverter to one of the multiple electrode patterns on the base film.

4. The photovoltaic module of claim 3, wherein a fastening groove is in the one of the multiple electrode patterns and one end of the cable comprises a connection terminal connecting to the fastening groove of the one of the multiple electrode patterns.

5. The photovoltaic module of claim 2, wherein the base film comprises an insulation layer, and
    wherein the first electrode pattern and the second electrode pattern are oriented in different directions from one another and the first electrode pattern is on one surface of the insulation layer and the second electrode pattern is on a different surface of the insulation layer.

6. The photovoltaic module of claim 1, wherein the screen is on a front surface of the solar cell module and the multiple electrode patterns allow light to pass therethrough.

7. The photovoltaic module of claim 6, further comprising an adhesion layer in between the screen and the solar cell module.

8. The photovoltaic module of claim 1, wherein the solar cell module comprises a front surface substrate on an upper surface of a plurality of solar cells and a rear surface substrate on a lower surface of the plurality of solar cells, the rear surface substrate having a multi-layer structure and the screen on the multi-layered rear surface substrate.

9. The photovoltaic module of claim 8, wherein the multiple electrode patterns include an opaque material.

10. The photovoltaic module of claim 1, further comprising a junction box on a rear surface of the solar cell module including the inverter.

11. The photovoltaic module of claim 10, wherein the junction box comprises a capacitor unit storing DC power and a converter performing level conversion of the stored DC power.

12. The photovoltaic module of claim 1, wherein the first electrode pattern and the second electrode pattern are parallel to each other.

13. The photovoltaic module of claim 1, further comprising a charging-discharging unit charging and discharging the DC voltage.

14. The photovoltaic module of claim 1, wherein the first electrode pattern comprises first multiple electrode lines parallel with each other and a first connector connecting a first end of each of the first multiple electrode lines, wherein the second electrode pattern is comprises second multiple electrode lines parallel with each other alternately oriented with the first multiple electrode lines and a second connector connecting a first end of each of the second multiple electrode lines, wherein the switch comprises multiple first switches configured to connect and disconnect a second end of each of the second multiple electrode lines to the first connector; and wherein the switch further comprises multiple second switches configured to connect and disconnect a second of each of the first multiple electrode lines to the second connector.

15. The photovoltaic module of claim 14, wherein at least one of the first connector and the second connector is formed as a pad wider than those of the first multiple electrode lines and the second multiple electrode lines.

16. The photovoltaic module of claim 14, further comprising a controller configured to control operation of the multiple first switches and the multiple second switches.

17. The photovoltaic module of claim 1, wherein the multiple electrode patterns are three electrode patterns separated from each other, and wherein the AC voltage is three-phase AC voltage supplied to the three electrode patterns.

18. The photovoltaic module of claim 17, wherein the switch connects the three electrode patterns in Y connection.

19. The photovoltaic module of claim 1, further comprising a controller configured to control timing of AC voltage supply to the screen and operation of the switch.

* * * * *